(12) United States Patent
Shimoida et al.

(10) Patent No.: US 7,436,004 B2
(45) Date of Patent: Oct. 14, 2008

(54) SEMICONDUCTOR DEVICE

(75) Inventors: Yoshio Shimoida, Yokosuka (JP);
Masakatsu Hoshi, Yokohama (JP);
Hideaki Tanaka, Yokohama (JP);
Tetsuya Hayashi, Yokosuka (JP);
Toshiro Shinohara, Yokosuka (JP);
Shigeharu Yamagami, Yokosuka (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 304 days.

(21) Appl. No.: 11/289,460

(22) Filed: Nov. 30, 2005

(65) Prior Publication Data

US 2006/0118818 A1    Jun. 8, 2006

(30) Foreign Application Priority Data

Dec. 2, 2004 (JP) ............................. 2004-349666
Aug. 30, 2005 (JP) ............................. 2005-249595

(51) Int. Cl.
*H01L 31/0328* (2006.01)
*H01L 31/0336* (2006.01)
*H01L 31/072* (2006.01)
*H01L 31/109* (2006.01)
*H01L 31/111* (2006.01)

(52) U.S. Cl. ............... 257/183; 257/200; 257/107; 257/121

(58) Field of Classification Search ............... 257/183, 257/401, 121, 107, 90
See application file for complete search history.

(56) References Cited

U.S. PATENT DOCUMENTS

| 4,534,033 | A | * | 8/1985 | Nishizawa et al. ......... 372/50.1 |
| 4,972,239 | A | | 11/1990 | Mihara |
| 5,360,987 | A | | 11/1994 | Shibib |
| 5,894,141 | A | | 4/1999 | Bhalla |
| 2002/0041003 | A1 | | 4/2002 | Udrea et al. |
| 2003/0071305 | A1 | | 4/2003 | Matsudai et al. |
| 2004/0217358 | A1 | | 11/2004 | Kaneko |

FOREIGN PATENT DOCUMENTS

| EP | 0 615 292 A1 | 9/1994 |
| JP | 60-170263 A | 9/1985 |
| JP | 2003-318389 A | 11/2003 |
| JP | 2003-318398 A | 11/2003 |

OTHER PUBLICATIONS

Proceedings of the 16th International Symposium on Power Semiconductor Devices & ICs, ISSPO'04, May 24-27, 2004, 5 pages.
T. Zhang, "Study on the Commutation Technique of Matrix Converter," Journal of Tianjin University, vol. 35, No. 1, Jan. 2002, pp. 35-38.

* cited by examiner

*Primary Examiner*—Chuong A. Luu
(74) *Attorney, Agent, or Firm*—Foley & Lardner LLP

(57) ABSTRACT

An aspect of the present invention provides a semiconductor device that includes, a first semiconductor body of a first conductivity type, a first switching mechanism provided on the first semiconductor body, configured and arranged to switch on/off current flowing through the semiconductor device, and a first reverse-blocking heterojunction diode provided on the semiconductor body, configured and arranged to block current reverse to the current switched on/off by the first switching mechanism.

14 Claims, 6 Drawing Sheets

SEMICONDUCTOR DEVICE

TECHNICAL FIELD

The present invention relates to a semiconductor device having a switching mechanism which switches a current on and off.

BACKGROUND ART

As a related art, there is a reverse-blocking element using an IGBT (Insulated Gate Bipolar Transistor) described in Proceedings of 2004 International Symposium on Power Semiconductor Devices & ICs, Kitakyushu, P121-124. In the related aft, for an application such as a matrix converter, the reverse-blocking diode included in the IGBT is used for reverse blocking.

DISCLOSURE OF THE INVENTION

In order to obtain the reverse-blocking characteristics, it is necessary to think out the peripheral structure. In particular, in order to suppress the occurrence of the leakage current after dicing at element edge portions, it has been necessary that the junction isolation using a deep diffusion layer be performed, or that the isolation structure be formed through deep trench etching.

An object of the present invention is to provide a semiconductor device enabling simplification of the manufacturing process of the peripheral structure.

In the present invention, a switching mechanism and a reverse-blocking heterojunction diode are formed on the same semiconductor body. An aspect of the present invention provides a semiconductor device that includes, a first semiconductor body of a first conductivity type, a first switching mechanism provided on the first semiconductor body, configured and arranged to switch on/off current flowing through the semiconductor device, and a first reverse-blocking heterojunction diode provided on the semiconductor body, configured and arranged to block current reverse to the current switched on/off by the first switching mechanism.

BEST MODE FOR CARRYING OUT THE INVENTION

Figure 1:
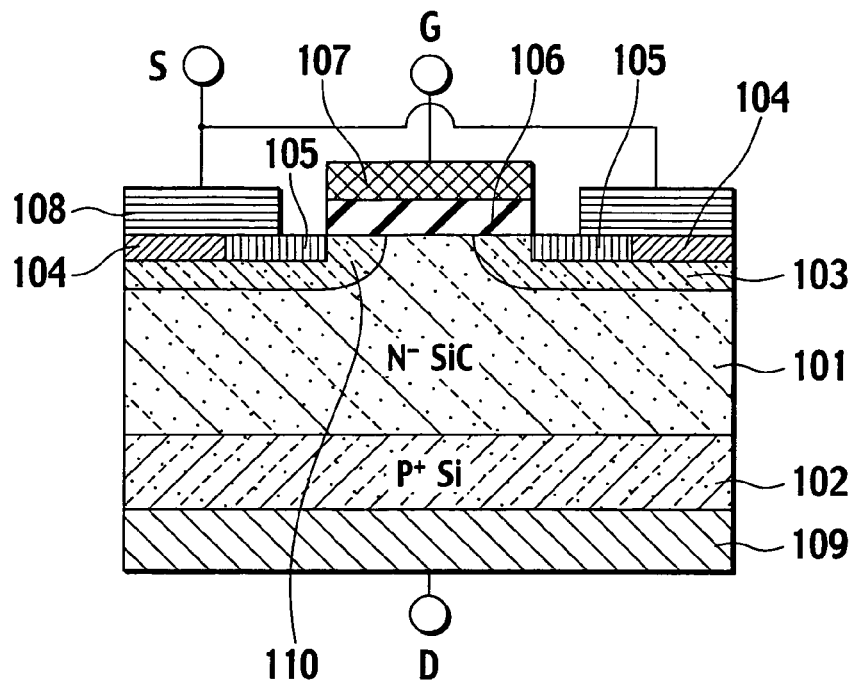
FIG. 1 is a cross-sectional view showing a structure of an element portion of a semiconductor device according to a first embodiment of the present invention.

Various embodiments of the present invention will be described with reference to the accompanying drawings. It is to be noted that same or similar reference numerals are applied to the same or similar parts and elements throughout the drawings, and the description of the same or similar parts and elements will be omitted or simplified.

First Embodiment

FIG. 1 is a cross-sectional view showing a structure of an element portion of a semiconductor device according to a first embodiment of the present invention. As shown in the figure, on a first principal face side of a drain region 101 of $N^-$-type SiC (silicon carbide), a power MOSFET is formed. The poly-type of SiC may be 4H, 6H, 3C, or the other. Instead, GaN or diamond may be used, both of which are the wide-band-gap material excellent in the power device application.

The power MOSFET as a switching mechanism may be replaced by a switching mechanism using another switching device. For example, a JFET, a MESFET, a bipolar transistor, or a switch which uses a heterojunction and is described in Japanese Laid-open Patent publication No. 2003-318398, may be used. In the case of the power MOSFET, for example, a p-type well region 103 and an $N^+$-type source region 105 are formed through double diffusion, wherein edges of a gate electrode 107 formed with a gate insulation film 106 interposed are utilized. A channel region 110 is formed in a surface of the p-type well region 103 in contact with the $N^+$- type source region 105 under the gate electrode 107. The on and off states of the current flowing between a drain electrode 109 and a source electrode 108 are switched to each other by controlling the potential applied to the gate electrode 107. In other words, in the case of the power MOSFET, the switching mechanism includes the gate electrode 107, the gate insulation film 106, and the channel region 110. In the case of the JFET, for example, relatively deep P-type well regions of low concentration are formed with a relatively shallow N-type source region of high concentration interposed therebetween. These P-type well regions become gate regions, and a gate electrode is formed on each of the gate regions. The region sandwiched between the deep P-type well regions becomes a channel region. Thus, a switching mechanism is formed, with which the number of the majority carriers injected from the N-type source region is controlled by changing the height of the potential barrier existing across the channel region by using the gate voltage and the drain voltage. In other words, in the case of the JFET, the switching mechanism includes the gate electrodes and the channel region. In the switching mechanism using a heterojunction, a gate electrode is provided adjacent a heterojunction interface with a gate insulation layer interposed therebetween. The on and off states of the current are switched to each other in such a way that a tunnel current is flowed by controlling the width of the energy barrier, which is caused by the heterojunction, by controlling the potential applied to the gate electrode. In the case of GaN, a channel structure using a two-dimensional electron gas cloud may be adopted.

In the case of the power MOSFET, a description can be given as follows. The N+-type source region 105 and a P+-type well contact region 104 are formed in the P-type well region 103. On the gate insulation film 106 formed on the first principal face side so as to overlap the plurality of p-type well regions 103, which are dispersedly disposed, the gate electrode 107 is formed. The source electrode 108, which is made of metal, for example, is formed so as to be connected to the N+-type source region 105 and the P+-type well contact region 104. Although FIG. 1 representatively shows a form in which two basic unit cells face each other, in fact, a number of cells are connected in parallel. The concentration and the thickness of a drain region 101 is set in accordance with the withstand voltage required. With regard to the thickness, in order to obtain the withstand voltage of the order of 1000 V, as an example, the thickness may be of the order of 10, m.

In this embodiment, on a second principal face side (the back side) of the drain region 101, a P+-type hetero semiconductor region 102 of P+-type polysilicon is formed, so that a reverse-blocking heterojunction diode, which blocks the current reverse to the current switched on and off by the power MOSFET, is formed. This P+-type hetero semiconductor region 102 is ohmically connected to the drain electrode 109 of metal, for example.

A description will now be given of a method of manufacturing the semiconductor device of this embodiment First of all, the N−-type drain region 101 may be formed on an N+-type SiC substrate (not shown) through epitaxial growth By slicing or, from the back side, grinding the thus formed substrate, it is possible to derive the N−-type drain region 101 therefrom. It is also possible to use a process, such as CMP (Chemical Mechanical Polishing), instead of the mechanical grinding. Thereafter, the P+-type hetero semiconductor region 102 of P+-type polysilicon is formed on the second principal face side (the back side) of the drain region 101. Then, the drain region 109 of metal, for example, is formed on the P+-type hetero semiconductor region 102 for ohmic contact.

In the related art, in order to suppress the occurrence of the leakage current after dicing at element edge portions, the peripheral structure is devised in such a way that the junction isolation using a deep diffusion layer is performed, or that the isolation structure is formed through deep trench etching. However, in this embodiment, when the peripheral structure is formed, the distance in the depth direction of the semiconductor body is small, so that the process of manufacturing the peripheral structure can be simplified.

In this embodiment, since the breakdown electric field strength is significantly high as compared to the case of Si because the wide-band-gap semiconductor, such as SiC, is used, it is possible to reduce the thickness of the drain region 101 to, for example, 10, m, as described above, when it is attempted to achieve the same withstand voltage of an element. Accordingly, in the element isolation region in the peripheral structure, neither the deep trench etching nor the formation of diffusion layers is required, and it is possible to easily form the peripheral structure.

A description will be now given of an operation of the semiconductor device of this embodiment. The principal current flowing through the element is switched on and off by the action of the part of the switching mechanism including the power MOSFET. In the operation of the original vertical-type power MOSFET, the principal current flows from the drain electrode 109 to the source electrode 108. However, in this embodiment, the heterojunction formed between the P+-type hetero semiconductor region 102 of P+-type polysilicon and the N−-type drain region 101 functions as the heterojunction diode blocking the reverse current According to the experimental results, which we obtained through diligent effort, for the purpose of obtaining the diode characteristics such that the withstand voltage is high and the leakage current is small, P+-type is preferable. In addition, when such a heterojunction is used, there is no injection of the minority carriers from the heterointerface when the forward current flows, and it is possible to significantly reduce the voltage drop in the forward direction in comparison with the diode comprising the PN junction of Si. By adopting the structure of this embodiment, it is possible to form the heterojunction diode with high withstand voltage and low leakage current in series with the switching mechanism comprising the power MOSFET. Moreover, by connecting two pairs of such a heterojunction diode and switching mechanism in parallel in such a manner that the polarities thereof are opposite to each other, it is possible to easily form the bidirectional switching circuit capable of switching the current on and off bidirectionally.

Such a bidirectional switching circuit is an elemental circuit which is essential to such an application as a matrix converter. With this embodiment since the injection of the minority carriers in the forward direction does not occur when an L-load (inductive load), such as a motor, is driven, the characteristics of the switching circuit during the reverse recovery operation are excellent (both of the reverse recovery charge and the reverse recovery time are very small). Accordingly, such a bidirectional switching circuit is advantageous to the downsizing and cost reduction of the power electronics systems represented by the matrix converter.

As described above, in this embodiment, in the same semiconductor body (the N−-type drain region 101, in this embodiment), formed are the switching mechanism, which switches the current on and off (the power MOSFET, in this embodiment), and the reverse-blocking heterojunction diode, which blocks the current reverse to the current switched on and off by the switching mechanism. The switching mechanism is formed on the first principal face side of the semiconductor body, and the heterojunction diode is formed on the second principal face side opposite to the first principal face of the semiconductor body.

In the above related art, when the peripheral structure is formed by using the junction isolation, the resulting structure is such that the back face and the periphery are surrounded by the P-type region, and the number of minority carriers injected during the forward bias of the PN junction increases, which has been a factor causing the deterioration of the switching characteristics. On the other hand, in this embodiment, the above described structure makes it possible to use the heterojunction, which includes the semiconductor body and the hetero semiconductor region 102, as the reverse-blocking heterojunction diode, so that the falling voltage Vf in the forward direction can be dramatically reduced. At the same time, there is no injection of the minority carriers, and the switching characteristics, such as the reverse recovery characteristics, can be improved. In addition, since the distance in the depth direction of the semiconductor body is small, the process of manufacturing the peripheral structure can be simplified. Moreover, since the heterojunction diode is formed on the second principal face side of the semiconductor body, the falling voltage Vf in the forward direction can be reduced, and the switching characteristics, such as the reverse recovery characteristics, can be improved.

In addition, since the semiconductor body is allowed to have a first conductivity type, and the hetero semiconductor region of the heterojunction diode is allowed to have a second conductivity type with high concentration, the switching characteristics, such as the reverse recovery characteristics, can be improved.

Moreover, the semiconductor body in the embodiment is made of silicon carbide, GaN, or diamond, and the hetero semiconductor region 102 is made of monocrystal silicon, polysilicon, amorphous silicon, silicon carbide, or polycrystalline silicon carbide, so that it is possible to easily fabricate a semiconductor device including a high-withstand-voltage heterojunction diode, using common semiconductor materials.

Second Embodiment

Figure 2:
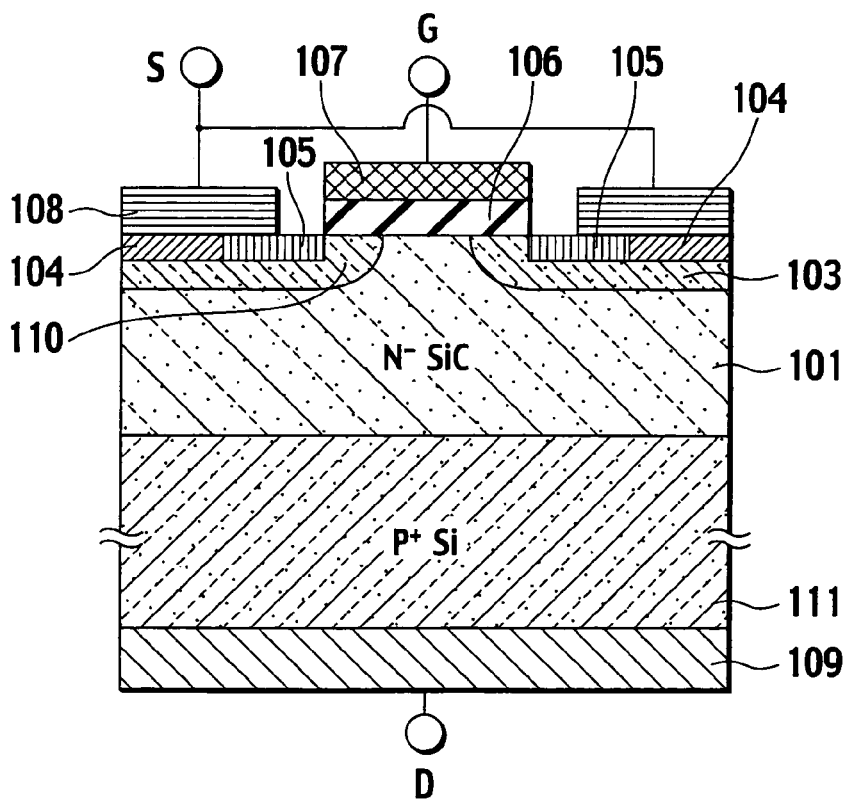
FIG. 2 is a cross-sectional view showing a structure of an element portion of a semiconductor device according to a second embodiment of the present invention.

FIG. 2 is a cross-sectional view showing a structure of an element portion of a semiconductor device according to a second embodiment of the present invention. In FIG. 2, in this embodiment, a P+-type silicon substrate 111 is used instead of the P+-type hetero semiconductor region 102 of P+-type polysilicon used in the first embodiment shown in FIG. 1. The other structures may be the same as those of the first embodiment In the first embodiment, it is necessary to obtain the N−-type drain region 101 by grinding or slicing the N+-type SiC substrate. On the other hand, in this embodiment, since the substrate which is obtained by forming a drain region 101 of N−-type SiC on the silicon substrate (P+-type silicon substrate 111) through heteroepitaxial growth, is used, there is a distinctive effect that the N−-type drain region can be easily formed without such grinding or slicing as is performed in the first embodiment. In the case where the polytype of SiC is 3C, it is possible to perform heteroepitaxial growth of SiC on a silicon substrate, and the effect of reducing cost by virtue of the increase of wafer size can be expected. It is also possible to laminate the N−-type SiC drain region 101 onto the P+-type silicon substrate.

Third Embodiment

Figure 3:
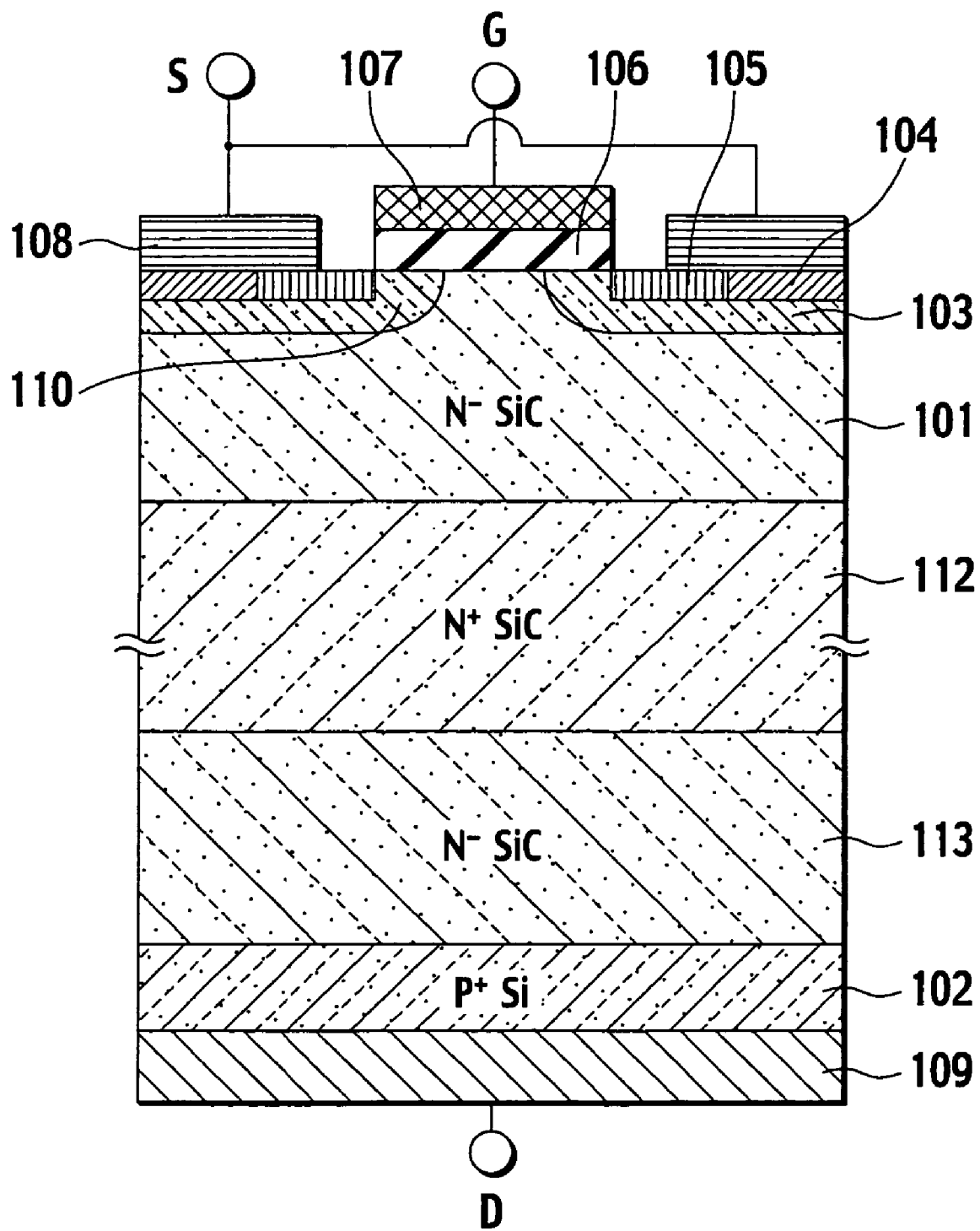
FIG. 3 is a cross-sectional view showing a structure of an element portion of a semiconductor device according to a third embodiment of the present invention.

FIG. 3 is a cross-sectional view showing a structure of an element portion of a semiconductor device according to a third embodiment of the present invention. In this embodiment, the structure is such that an N−-type SiC drain region 101 is formed on an N+-type SiC substrate 112 through epitaxial growth or the like, and an N−-type drain region 113 is formed also on the other side of the N+-type SiC substrate 112 through epitaxial growth or the like. The other structures may be the same as those of the first embodiment.

In the first embodiment, it is necessary to obtain the N−-type drain region 101 by grinding or slicing the N+-type SiC substrate. However, this is unnecessary in this embodiment, and the process can therefore be simplified. With the N+-type SiC substrate 112 left, the N−-type drain region 113, which is formed through epitaxial growth, is formed on the opposite side.

Fourth Embodiment

Figure 4A:
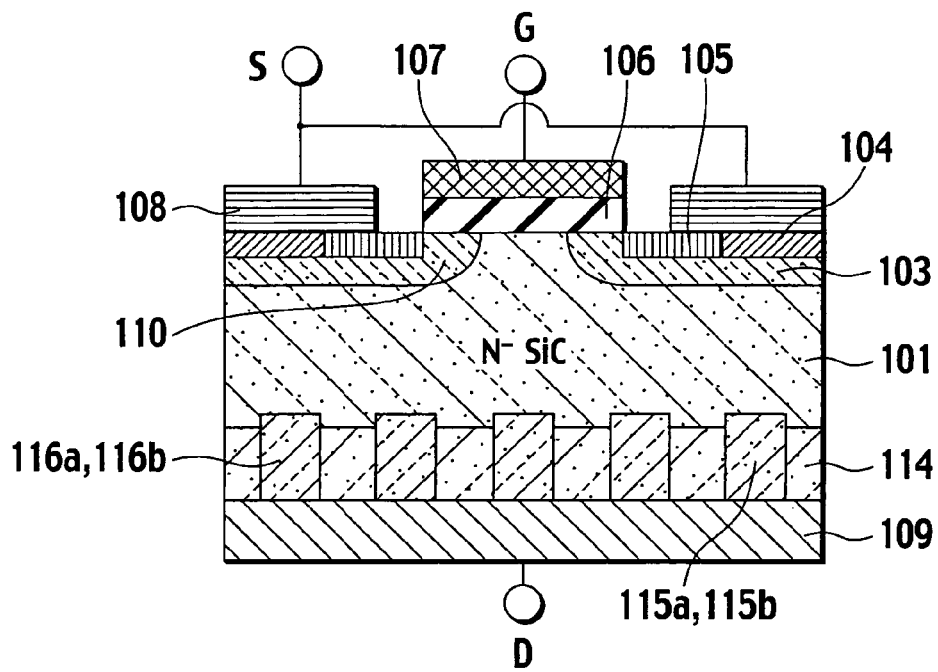
FIG. 4A is a cross-sectional view showing a structure of an element portion of a semiconductor device according to a fourth embodiment of the present invention.
Figure 4B:
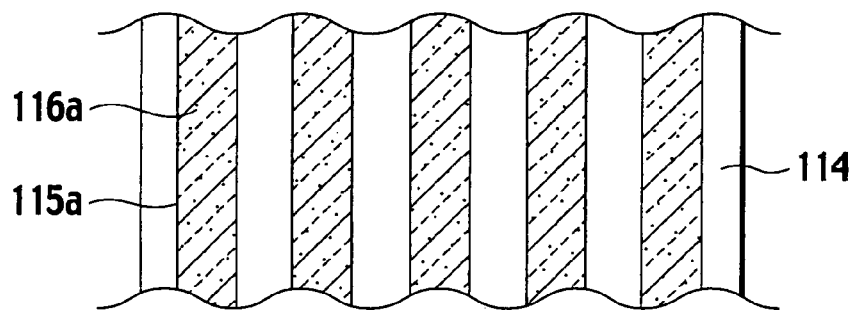
FIG. 4B is a plan view showing a planar layout of a $P^+$-type hetero semiconductor region.
Figure 4C:
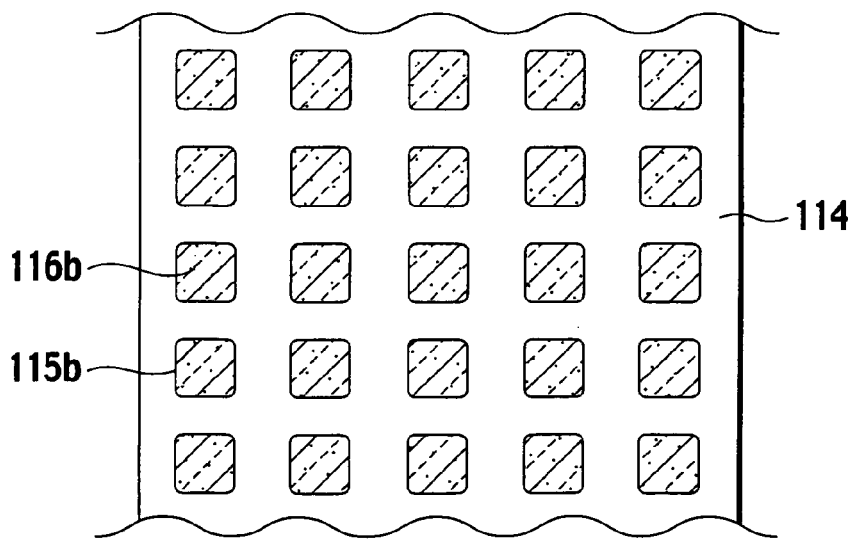
FIG. 4C is a plan view showing another planar layout of the $P^+$-type hetero semiconductor region.

FIG. 4A is a cross-sectional view showing a structure of an element portion of a semiconductor device according to a fourth embodiment of the present invention. FIG. 4B is a plan view showing a planar layout of a P+-type hetero semiconductor region. FIG. 4C is a plan view showing another planar layout of the P+-type hetero semiconductor region.

In this embodiment, a plurality of P+-type hetero semiconductor regions 116a (or 116b) of P+-type polysilicon, which is in contact with an N−-type drain region 101 on the second principal face side thereof, are alternately arranged, as shown in the figures. The other structures may be the same as those of the first embodiment. The planar layouts of the P+-type hetero semiconductor regions 116a and 116b are shown in FIGS. 4B and 4C, respectively. It is possible to form the P+-type hetero semiconductor regions 116a in a stripe shape as shown in FIG. 4B, or to form the P+-type hetero semiconductor regions 116b in a rectangular dot shape (cell arrangement) as shown in FIG. 4C.

After an N+-type SiC substrate 114, on which the N−-type drain region 101 is formed through epitaxial growth, is grinded or sliced thin, trenches 115a or 115b are formed through a process such as trench etching. Thereafter, by depositing the P+-type polysilicon in the trenches 115a or 115b, the P+-type hetero semiconductor regions 116a or 116b are formed.

Arranging the N+-type SiC substrate 114 and the plurality of P+-type hetero semiconductor regions 116a (or 116b) alternately in this way makes it possible to further reduce the voltage drop in the forward direction at the heterointerfaces between the N−-type drain region 101 and the P+-type hetero semiconductor regions 116a or 116b. In addition, it is possible to control the falling voltage Vf in the forward direction at the time of design by utilizing the ratio of the contacting area between the P+-type hetero semiconductor regions 116a or 116b and the N−-type drain region 101. In order to maintain the reverse blocking capability, it is necessary that adjacent P+-type hetero semiconductor regions 116a or 116b function as a normally-off JFET when the reverse bias is applied. In FIG. 4A, the structure that the P+-type hetero semiconductor regions 116a or 116b enter the N−-type drain region 101 somewhat deeply, is for obtaining this effect.

As described above, in this embodiment, the plurality of P+-type hetero semiconductor regions 116a or 116b and semiconductor substrate regions of the first conductivity type (N+-type SiC substrate 114) are alternately arranged on the second principal face side of the semiconductor body. Such a structure makes it possible to further reduce the voltage drop in the forward direction while maintaining the reverse-blocking characteristics.

Fifth Embodiment

Figure 5:
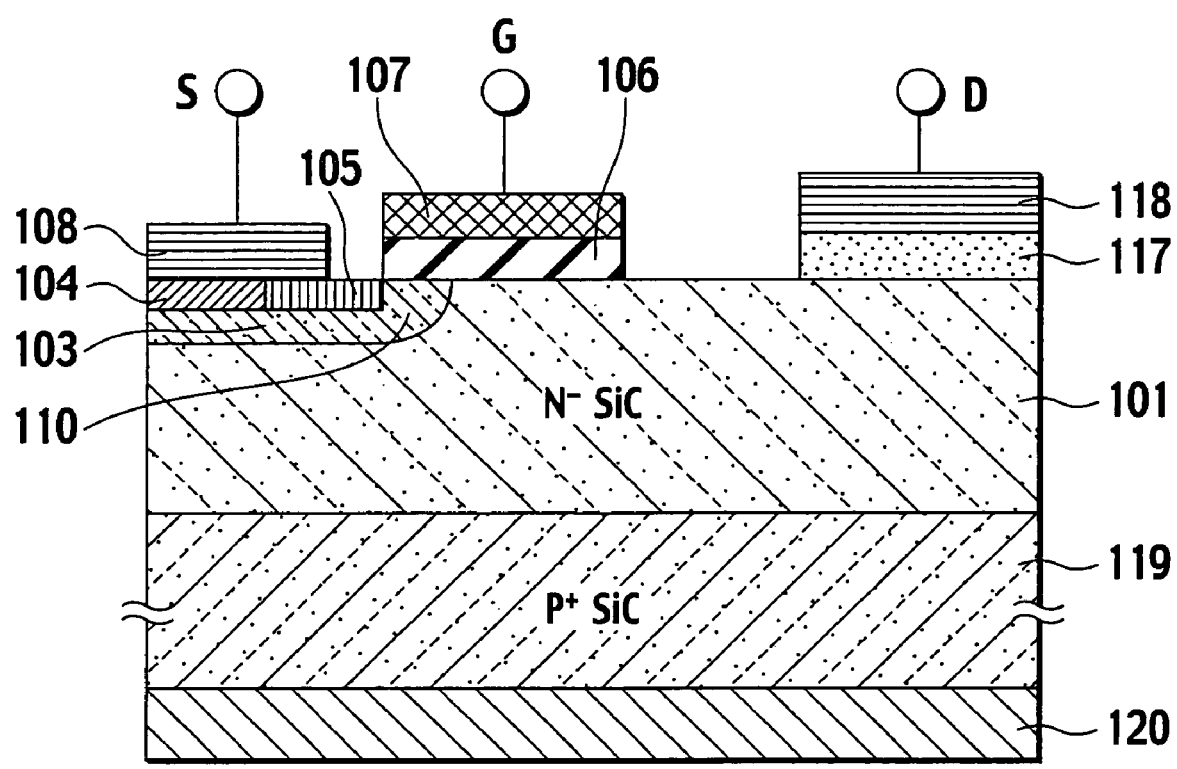
FIG. 5 is a cross-sectional view showing a structure of an element portion of a semiconductor device according to a fifth embodiment of the present invention.

FIG. 5 is a cross-sectional view showing a structure of an element portion of a semiconductor device according to a fifth embodiment of the present invention. In FIG. 5, the semiconductor device of this embodiment includes: a P+-type hetero semiconductor region 117 of P+-type polysilicon, which is in contact with an N−-type drain region 101 on the first principal face side thereof; a drain electrode 118; a P+-type SiC substrate 119; and aback electrode 120.

This embodiment is an example in which the present invention is applied to a lateral device. The P+-type hetero semiconductor region 117 and the drain electrode 118 are formed on the same surface on the first principal face side of the drain region 101. On the back side (the second principal face side), the P+-type SiC substrate 119 is formed. In addition, on the p+-type SiC substrate 119, the back electrode 120 is formed. This device is electrically isolated in the vertical direction by the PN junction between the N−-type drain region 101 and the P+-type SiC substrate 119, by fixing the potential of the back electrode 120 at the source potential. The other structures may be the same as those of the first embodiment.

This embodiment is characterized in that the reverse-blocking heterojunction diode is formed laterally. It should be noted that the structure of such a lateral power MOSFET as is shown in this embodiment is merely an example, and, although there are various other structures for the switching mechanism of the device, the present invention is applicable to any of these structures.

As described above, in this embodiment, the switching mechanism (the power MOSFET, in this embodiment) and the heterojunction diode are formed on the first principal face side of the semiconductor body (the N⁻-type drain region 101).

With such a structure, since the switching mechanism and the heterojunction diode are formed on the same principal face side, there is no injection of the minority carriers, and the switching characteristics, such as the reverse recovery characteristics, can be improved. In addition, since the distance in the semiconductor body in the lateral direction is small, the integration degree can be increased, and the on-resistance normalized by the area can sufficiently be reduced. At the same time, since the distance in the depth direction is also small, the process of manufacturing the peripheral structure can be simplified.

Sixth Embodiment

Figure 6A:
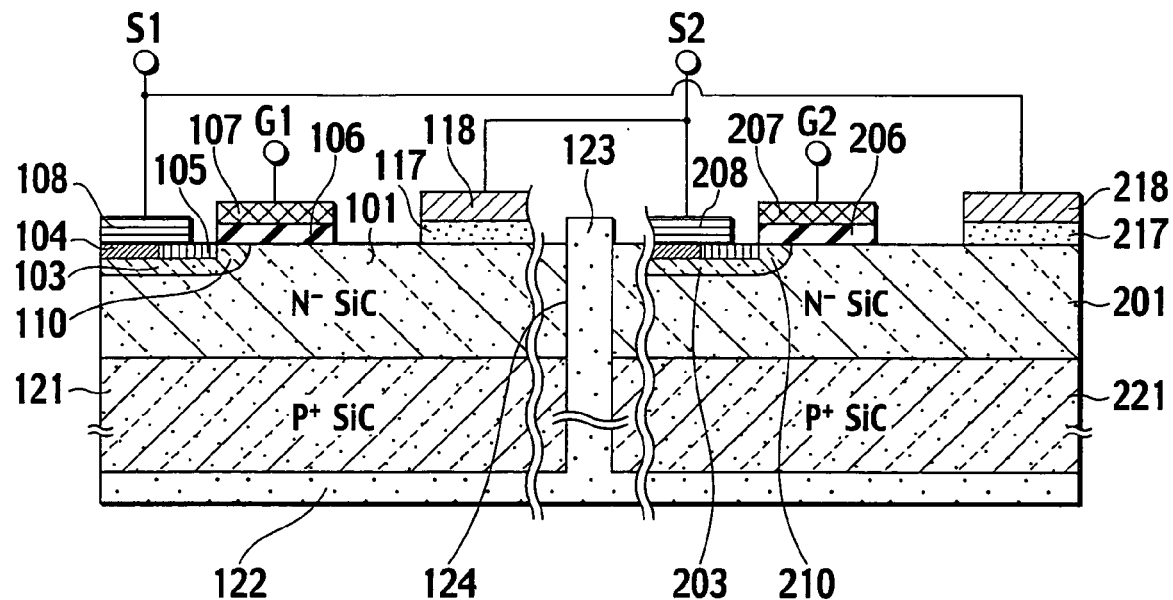
FIG. 6A is a cross-sectional view showing a structure of an element portion of a semiconductor device according to a sixth embodiment of the present invention.
Figure 6B:
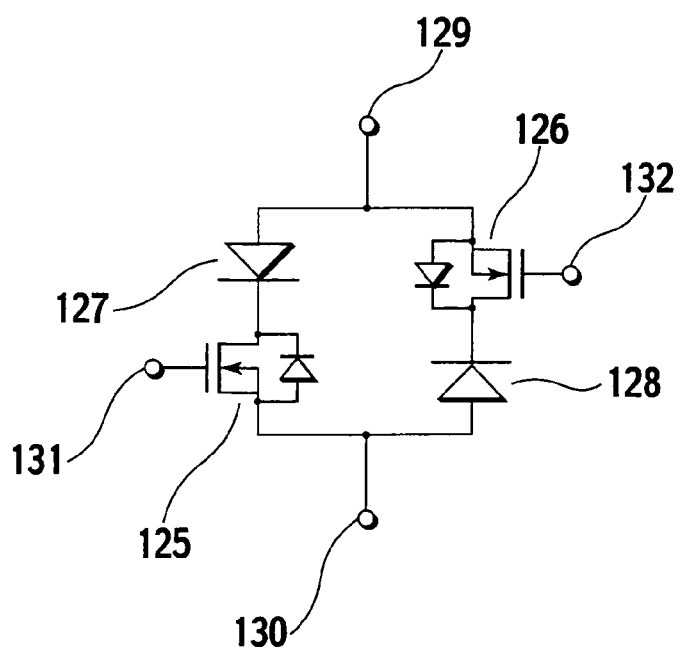
FIG. 6B is a circuit diagram.

FIG. 6A is a cross-sectional view showing a structure of an element portion of a semiconductor device according to a sixth embodiment of the present invention. FIG. 6B is a circuit diagram.

In FIG. 6A, N⁻-type SiC regions 101 and 201 are electrically isolated by a lateral-isolation region 123. Power MOSFETs are formed in the N⁻-type SiC region 101 and the N⁻-type SiC region 201, respectively, on the first principal face side thereof. With regard to these power MOSFETs, P-type well regions 103 and 203, and N⁺-type source regions 105 and 205 are formed through double diffusion, wherein edges of gate electrodes 107 and 207 formed with gate insulation films 106 and 107 interposed are utilized. Channel regions 110 and 210 are formed in surfaces of the p-type well regions 103 and 203 in contact with the N⁺-type source regions 105 and 205 under the gate electrodes 107 and 207. The on and off states of the current flowing between a drain electrode 118 and a source electrode 108 and between a drain electrode 218 and a source electrode 208 are switched to each other by controlling the potential applied to the gate electrodes 107 and 207, respectively. Here, on the second principal face side of the semiconductor body comprising a P⁺-type SiC region 121 and the N⁻-type drain region 101, a vertical-isolation region 122 made of an SiO₂ film which is deposited through the CVD method, for example, is provided, and the semiconductor body is etched to form a trench 124. Thereafter, by providing, in the trench 124, the lateral-isolation region 123 made of the SiO₂ film which is deposited through the CVD method, the left and right semiconductor bodies are electrically isolated.

In addition, in FIG. 6B, the semiconductor device of the sixth embodiment includes a first switching mechanism 125, a second switching mechanism 126, a first heterojunction diode 127, a second heterojunction diode 128, a first terminal 129, a second terminal 130, a first control terminal 131, and a second control terminal 132.

In this embodiment, an example is shown, in which a pair of elements described in the fifth embodiment are formed in the island-like regions isolated in the vertical and lateral directions by the vertical-isolation region 122 and the lateral-isolation region 123, being electrically connected to each other, wherein the drain and source electrodes are alternately connected.

Specifically, the switching mechanisms 125 and 126, and the heterojunction diodes 127 and 128 are individually formed in the electrically isolated regions in the same semiconductor body; the first terminal 129 (S1) to which the drain electrode 218 of one switching mechanism 125 and the source electrode 108 of the other switching mechanism 126 are electrically connected, is provided; and the second terminal 130 (S2) to which the source electrode 208 of one switching mechanism 125 and the drain electrode 118 of the other switching mechanism 126 are electrically connected, is provided, so that the current can be switched on and off bidirectionally between the first terminal S1 and the second terminal S2.

Figure 7:
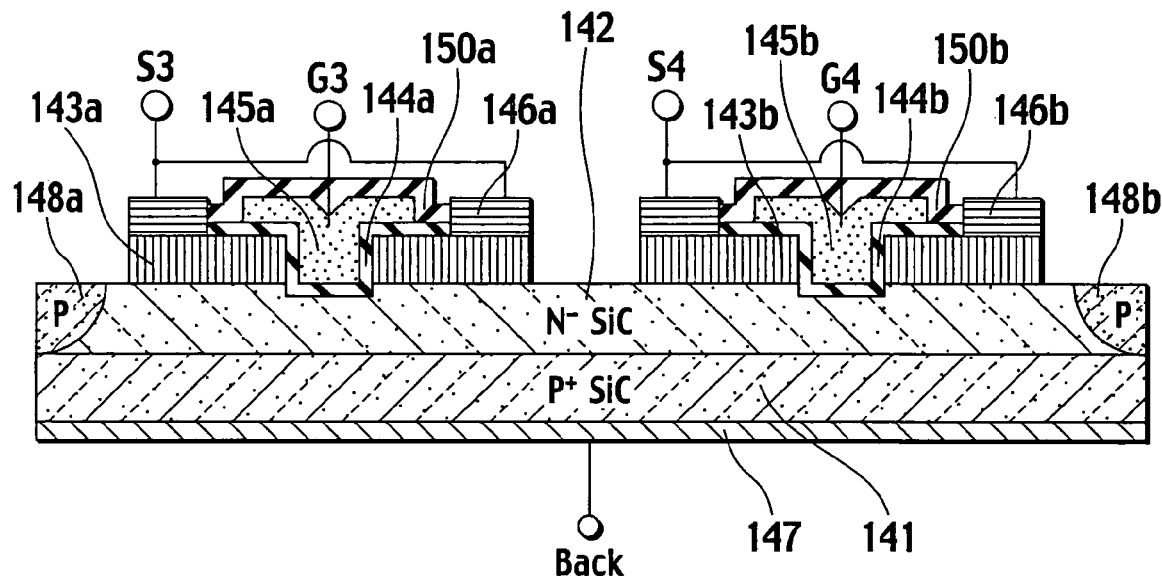
FIG. 7 is a cross-sectional structure diagram of an element portion of a semiconductor device according to a seventh embodiment of the present invention.

In this embodiment, by adopting such a structure as is described above, the reverse-blocking switches are connected in antiparallel, and therefore function as a bidirectional switch. A feature of this embodiment is that a bidirectional switching element can monolithically be formed small in one chip. Accordingly, also in terms of the rationalization of the number of chips and the area reduction, this embodiment can significantly contribute to the downsizing and cost reduction of the systems. In addition, this embodiment can significantly contribute to the downsizing of the systems, such as matrix converters, which are considered as an application. The other structures, operations and effects are the same as those of the fifth embodiment Seventh Embodiment FIG. 7 is a cross-sectional structure diagram of an element portion of a semiconductor device according to a seventh embodiment of the present invention. First of all, the structure will be described. In FIG. 7, basic unit cells are symmetrically arranged. In the regions in which the respective basic unit cells are placed, the switching mechanisms are formed. However, in fact, the switching mechanism is constituted in such a way that a plurality of basic unit cells described above are arranged side by side.

An N⁻-type SiC common drain region 142 (the first-conductivity-type semiconductor body) is made of the epitaxial layer grown on a P⁺-type SiC substrate 141 (the second-conductivity-type substrate of high concentration). Although there are some polytypes (crystal polymorphism) for SiC, a description will be given on the assumption that the polytype is 4H—SiC, which is representative. The polytype may also be another one, 6H—SiC or 3C—SiC. Although the thickness of the P⁺-type SiC substrate 141 and the thickness of the N⁻-type SiC common drain region 142 are shown equal to each other in FIG. 7, the P⁺-type SiC substrate 141 may have a thickness of several hundreds of micrometers, and the N⁻-type SiC common drain region 142 may have a thickness of about several to a dozen or so micrometers. Hetero semiconductor regions 143a and 143b of polysilicon are formed on the first principal face side (the front side) of the N⁻-type SiC common drain region 142. The band gaps of SiC and polysilicon are different from each other, and the electron affinities thereof are also different from each other. Thus, a heterojunction is formed at the interface between the N⁻-type SiC common drain region 142 and the hetero semiconductor regions 143a and 143b (this is the reason why the polysilicon portion is referred to as the hetero semiconductor region). Gate electrodes 145a and 145b are formed adjacent the junction portion between the N⁻-type SiC common drain region 142 and the hetero semiconductor regions 143a and 143b with gate insulation films 144a and 144b interposed therebetween. The hetero semiconductor regions 143a and 143b are connected to source electrodes 146a and 146b, respectively, and a back electrode 147 is connected to the back face of the P⁺-type SiC substrate 141. In the hetero semiconductor regions 143a and 143b, a region abutting on the gate insulation films 144a and 144b, a current path connected to the source electrodes 146a and 146b, and a part of a contact region abutting on the source electrodes 146a and 146b are N-type, and the other region is P+-type. The gate electrodes 145a and 145b are dielectricaly isolated from the source electrodes 146a and 146b via interlayer insulation films 150a and 150b, respectively. A terminal S3 (a third terminal) is connected to the source electrode 146a, and a terminal S4 (a fourth terminal) is connected to the source electrode 145b. Specifically, the terminals S3 and S4 are provided on the first principal face side of the N$^-$-type SiC common drain region 142, and the current flowing between the terminals S3 and S4 is switched on/off. A terminal G3 (a control terminal) is connected to the gate electrode 145a, and a terminal G4 (a control terminal) is connected to the gate electrode 145b, wherein the terminals G3 and G4 are independent of each other. In this way, formed are a switching mechanism, which includes the hetero semiconductor region 143a, the gate insulation film 144a, the gate electrode 145a, and the source electrode 146a; a reverse-blocking heterojunction diode, which blocks the current reverse to the current switched on and off by this switching mechanism; a switching mechanism, which includes the hetero semiconductor region 143b, the gate insulation film 144b, the gate electrode 145b, and the source electrode 146b; and a reverse-blocking heterojunction diode, which blocks the current reverse to the current switched on and off by this switching mechanism. The pair of switching mechanisms are arranged symmetrically in the same structure on the first principal face side of the N$^-$-type SiC common drain region 142. In addition, in the peripheral structure of the element, element isolation regions 148a and 148b are provided so that there is no influence of the leakage current in the dicing region.

In this semiconductor device, the driving point is where the interface between the gate insulation film 144a (144b) and the N$^-$-type SiC common drain region 142, the interface between the gate insulation film 144a (144b) and the hetero semiconductor region 143a (143b), and the interface between the N$^-$-type SiC common drain region 142 and the hetero semiconductor regions 143a (144b) meet. When the switching mechanism is turned on, the current induced by the tunneling current flows near the driving point. The basic on/off operation of the switching mechanism is the same as that of the semiconductor device described in Japanese Patent Laid-open No. 2003-318389. Specifically, when a positive voltage is applied to the gate electrodes 145a and 145b, an electric field is applied to the heterojunction interface between the N$^-$-type SiC common drain region 142 and the hetero semiconductor regions 143a and 143b, so that the thickness of the energy barrier caused by the heterojunction interface becomes small. When the thickness of the energy barrier becomes sufficiently small, that is, of the order of 100 A, electrons pass through the barrier due to the tunnel effect. As a result, even when the drain voltage is equal to or lower than a predetermined voltage, the tunnel effect occurs, and the current starts to flow.

A description will now be given of an operation of the semiconductor device of this embodiment. Within the range of the voltage used in the system, a ground or lower potential is applied to the back electrode 147. The element isolation has been performed in the vertical direction via the PN junction formed between the P+-type SiC substrate 141 and the N$^-$-type SiC common drain region 142. Between the N$^-$-type SiC common drain region 142 and the element isolation regions 148a and 148b, the element isolation has been performed in the lateral direction. The switching on/off of the current flowing between the terminals S3 and S4 is controlled by the voltage applied to the terminals G3 and G4 (the gate electrodes 145a and 145b) of the respective switching mechanisms. By simultaneously turning on the two switching mechanism, it is possible to flow the current in a state where the falling voltage Vf is not caused in the forward direction of the switching mechanism. For example, when a higher potential is applied to the terminal S3 and a lower potential is applied to the terminal S4, it is possible to turn on the switching mechanism having the terminal G4 by setting the potentials of the terminal S4 and the back electrode 147 equal to each other, and applying, to the terminal G4, a potential which is, relative to the potential applied to the terminal S4, raised by a voltage whose value is equal to or larger than a threshold value. At the same time, it is possible to turn on the switching mechanism having the terminal G3 by applying, to the terminal G3, a potential which is, relative to the higher potential applied to the terminal S3, raised by a voltage whose value is equal to or larger than a threshold value. When a lower potential is applied to the terminal S3 and a higher potential is applied to the terminal S4, it is possible to flow the current in the opposite direction by applying the voltage oppositely compared to the above case. In addition, by turning off both of the switching mechanisms, it is possible to stop the current-flow in both directions. Moreover, by turning on one switching mechanism, it is possible to block the current in one direction, and to allow the conduction of the current in the other direction.

In such an operation, the conduction loss is governed by the on resistance when both of the switching mechanisms are in the on state, which results in the advantage that it is possible to sufficiently reduce the value of the loss. In addition, since the large area PN junction is not used as the current path, it is possible to suppress the increase of the switching loss due to the carriers injected during the forward bias state. Moreover, since the element isolation regions 148a and 148b in the peripheral structure require neither the deep trench etching nor the formation of the diffusion layer, the process of forming the element isolation regions 148a and 148b is simple. At the same time, since it is possible to reduce the surface area of the element isolation regions 148a and 148b, the effective area of the element becomes large. Furthermore, a bidirectional switching element can be monolithically formed small in one chip. As a result of the above effects, this embodiment is advantageous to the downsizing and cost reduction of the power electronics systems represented by the matrix converter, and can significantly contribute to the downsizing of the systems, such as matrix converters, which are considered as an application.

It should be noted that, although not shown in the figures, the pair of source electrodes 146a and 146b may have a two-layer wiring structure having a region in which these electrodes overlap each other in a laminar manner while being electrically insulated from each other. With such a two-layer wiring structure, it is possible to reduce the element area.

Eighth Embodiment

Figure 8:
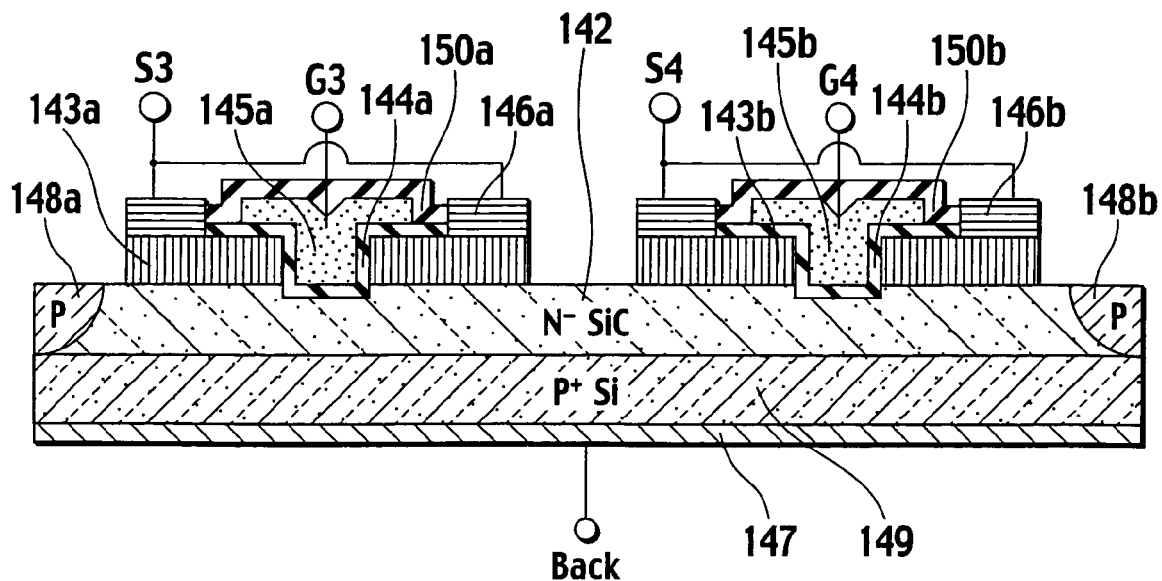
FIG. 8 is a cross-sectional structure diagram of an element portion of a semiconductor device according to an eighth embodiment of the present invention.

FIG. 8 is a cross-sectional structure diagram of an element portion of a semiconductor device according to an eighth embodiment of the present invention. The basic structure thereof is the same as that of the seventh embodiment. A description of the different portion is that a P+-type Si region 149 of Si is formed on the second principal face side (the back side) of an N$^-$-type SiC common drain region 142. The P+-type Si region 149 may be made of polysilicon or may be a Si substrate.

A description will be now given of an operation of the semiconductor device of this embodiment. The basic operation is the same as that of the semiconductor device of the first embodiment. The element isolation in the vertical direction has been performed via the heterojunction between the P⁺-type Si region 149 of Si and the N⁻-type SiC common drain region 142 of SiC.

In the semiconductor device of this embodiment, the P⁺-type Si region 149 made of an inexpensive Si substrate is used instead of the expensive SiC substrate, which results in a distinctive advantage that it is possible to reduce the cost of semiconductor devices.

As described above, with these embodiments, it is possible to provide a semiconductor device enabling the simplification of the manufacturing process of the peripheral structure.

The entire contents of Japanese patent applications P2004-349666 filed Dec. 2, 2004, and P2005-249595 filed Aug. 30, 2005, and Japanese Patent Laid-open publication No. 2003-318398 are hereby incorporated by reference.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

The invention claimed is:

1. A semiconductor device comprising:
    a first switching mechanism provided on a first semiconductor body, arranged and configured to switch on/off current flowing through the semiconductor device; and
    a first heterojunction diode arranged and configured to block current reverse to the current switched on/off by the first switching mechanism, said first heterojunction diode comprising:
        the first semiconductor body of a first conductivity type; and
        a first hetero semiconductor region, forming said first heterojunction with the first semiconductor body,
    wherein the first hetero semiconductor region is a second-conductivity-type hetero semiconductor region of high concentration, and the first hetero semiconductor region of the first heterojunction diode has at least two regions, said first hetero semiconductor region and the first semiconductor body are alternately arranged on a second principal face side of the first semiconductor body.

2. The semiconductor device as claimed in claim 1, wherein the first switching mechanism is a power MOSFET comprising a first source electrode, a first drain electrode, and a first gate electrode.

3. The semiconductor device as claimed in claim 1, wherein:
    the first switching mechanism is formed on a first principal face side of the first semiconductor body, and the first heterojunction diode is formed on the second principal face side of the first semiconductor body, said second principal face side being opposite to the first principal face side.

4. The semiconductor device as claimed in claim 1, wherein the first semiconductor body comprises:
    a semiconductor substrate of the first conductivity type;
    a first drain region of the first conductivity type formed on a first principal face side of the semiconductor substrate; and
    a second drain region having the first conductivity type formed on a second principal face side of the semiconductor substrate, said second principal face side being opposite to the first principal face side of the semiconductor substrate.

5. The semiconductor device as claimed in claim 1, wherein:
    the first switching mechanism and the first heterojunction diode are formed on a first principal face side of the first semiconductor body.

6. The semiconductor device as claimed in claim 1, wherein hetero semiconductor regions of the first heterojunction diode are provided in a stripe shape.

7. The semiconductor device as claimed in claim 1, wherein hetero semiconductor regions of the first heterojunction diode are provided in a dot shape.

8. A semiconductor device comprising:
    a first switching mechanism provided on a first semiconductor body, arranged and configured to switch on/off current flowing through the semiconductor device; and
    a first heterojunction diode arranged and configured to block current reverse to the current switched on/off by the first switching mechanism, said first heterojunction diode comprising:
        the first semiconductor body of a first conductivity type; and
        a first hetero semiconductor region, forming said first heterojunction with the first semiconductor body,
    wherein the first switching mechanism is a power MOSFET comprising a first source electrode, a first drain electrode, and a first gate electrode;
    a second semiconductor body of the first conductivity type;
    an isolation region electrically isolating the first and second semiconductor bodies;
    a second switching mechanism provided on the second semiconductor body, arranged and configured to switch on/off the current flowing through the semiconductor device, said second switching mechanism having a second source electrode, a second drain electrode, and a second gate electrode;
    a second heterojunction diode arranged and configured to block current reverse to the current switched on/off by the second switching mechanism, said second heterojunction diode comprising:
        the second semiconductor body of the first conductivity type; and
        a second hetero semiconductor region, forming said second heterojunction with the second semiconductor body;
    a first terminal to which the first drain electrode and the second source electrode are electrically connected; and
    a second terminal to which the first source electrode (108 and 146*a*) and the second drain electrode are electrically connected;
    wherein the current is switched on and off bidirectionally between the first and second terminals.

9. A semiconductor device comprising:
    a first switching mechanism provided on a first semiconductor body, arranged and configured to switch on/off current flowing through the semiconductor device; and
    a first heterojunction diode arranged and configured to block current reverse to the current switched on/off by the first switching mechanism, said first heterojunction diode comprising:
        the first semiconductor body of a first conductivity type; and
        a first hetero semiconductor region, forming said first heterojunction with the first semiconductor body, wherein the first switching mechanism is a power MOSFET comprising a first source electrode, a first drain electrode, and a first nate electrode;

a second switching mechanism provided on the first semiconductor body, arranged and configured to switch on/off current flowing through the semiconductor device, said second switching mechanism including a second source electrode and a second gate electrode;

a second hetero semiconductor region in contact with the first semiconductor body, said second hetero semiconductor region and the first semiconductor body forming a second heterojunction diode arranged and configured to block current reverse to the current switched on/off by the first switching mechanism;

a first control terminal connected to the first switching mechanism; and a second control terminal connected to the second switching mechanism;

wherein the first and second control terminals independently control the current to be flowed.

10. The semiconductor device as claimed in claim 9, wherein the first and second switching mechanisms are symmetrically arranged on a first principal face side of the first semiconductor body in the same structure.

11. The semiconductor device as claimed in claim 9, wherein the second switching mechanism comprises:

a second hetero semiconductor region having a band gap different from that of the first semiconductor body and connected to the second source electrode;

a gate insulation film provided adjacent a junction portion between the second hetero semiconductor region and the first semiconductor body and insulating the second gate electrode from the first semiconductor body;

a third terminal connected to the first source electrode; and a fourth terminal connected to the second source electrode;

wherein the first control terminal is connected to the first gate electrode and the second control terminal is connected to the second gate electrode.

12. The semiconductor device as claimed in claim 11, wherein, in the second hetero semiconductor region, regions of the first conductivity type are a region in contact with the gate insulation film, a current path connected to the first source electrode, and a part of a contact region in contact with the first source electrode, and the other region is a second conductivity type.

13. The semiconductor device as claimed in claim 11, wherein the first and second source electrodes have a two-layer wiring structure having a region in which these electrodes overlap each other in a laminar manner while being electrically insulated from each other.

14. The semiconductor device as claimed in claim 1, wherein the first semiconductor body is made of any one of silicon carbide, GaN, and diamond, and the first hetero semiconductor region of the first heterojunction diode has, as the main ingredient, any one of silicon, polysilicon, amorphous silicon, silicon carbide, and polycrystalline silicon carbide.

* * * * *